United States Patent [19]

Matzke et al.

[11] Patent Number: 4,736,191
[45] Date of Patent: Apr. 5, 1988

[54] TOUCH ACTIVATED CONTROL METHOD AND APPARATUS

[75] Inventors: Karl E. Matzke, 916 Castle Pl., Madison, Wis. 53703; Paul W. Schick, Madison, Wis.

[73] Assignee: Karl E. Matzke, Madison, Wis. ; by said Paul W. Schick

[21] Appl. No.: 762,049

[22] Filed: Aug. 2, 1985

[51] Int. Cl.$^4$ .................... H03K 17/96; H03K 17/975
[52] U.S. Cl. .................... 340/365 C; 340/709; 340/710; 340/365 S
[58] Field of Search .............. 340/365 C, 365 R, 709, 340/710, 711, 365 S, 706; 178/18, 19, 20

[56] References Cited

U.S. PATENT DOCUMENTS

| | | | |
|---|---|---|---|
| 3,757,322 | 9/1973 | Barkan et al. | 340/365 C |
| 3,931,610 | 1/1976 | Marin et al. | 340/365 C |
| 4,103,252 | 7/1978 | Bobick | 340/365 C |
| 4,110,749 | 8/1978 | Janko et al. | 340/365 C |
| 4,148,014 | 4/1979 | Burson | 340/709 |
| 4,177,421 | 12/1979 | Thornburg | 340/365 C |
| 4,246,452 | 1/1981 | Chandler | 340/365 C |
| 4,291,303 | 9/1981 | Cutler et al. | 340/365 S |
| 4,302,011 | 11/1981 | Pepper | 340/365 C |
| 4,313,113 | 1/1982 | Thornburg | 340/709 |
| 4,398,181 | 8/1983 | Yamamoto | 340/365 S |
| 4,475,235 | 10/1984 | Graham | 178/18 |
| 4,550,221 | 10/1985 | Mabusth | 178/18 |
| 4,595,913 | 6/1986 | Aubuchon | 340/365 C |

FOREIGN PATENT DOCUMENTS

| | | | |
|---|---|---|---|
| 2570849 | 3/1986 | France | 340/709 |
| 0168385 | 10/1982 | Japan | 178/18 |
| 0043026 | 3/1983 | Japan | 340/365 R |
| 0114628 | 7/1984 | Japan | 340/709 |

OTHER PUBLICATIONS

IBM Technical Disclosure Bulletin, "Keyboard Scanned Capacitive Joy Stick Cursor Control", J. E. Foy, vol. 23, No. 8, Jan. 1981, pp. 3831–3834.

Primary Examiner—John W. Caldwell, Sr.
Assistant Examiner—Alvin Oberley
Attorney, Agent, or Firm—Isaksen, Lathrop, Esch, Hart & Clark

[57] ABSTRACT

A cursor control device (10) is provided which has a touch pad (14) formed of individual conductive plates (16) forming sectors of a circle. A user's touch on a dielectric layer (18) overlying the plates (16) is detected by individually charging and discharging each of the sector plates in a sequential manner to determine the increased capacitance, if any, of each sector plate. A microprocessor assigns each of the sector plates a relative X and Y weighting as a function of its angular position in the touch pad which are combined with the individual plate capacitance readings to calculate the relative X and Y position of the touch with respect to the origin (28) of the touch pad. Cursor control signals proportional to the relative X and Y values, plus a Z value proportional to the area of touch, if desired, are provided to the keyboard (12) of a displaying computer. The touch pad (14) can be effectively integrated into a computer keyboard by positioning it immediately beneath the space bar (25) of the keyboard so that it can be accessed by the thumb of the user without requiring the user to move his or her hand from the keyboard.

31 Claims, 8 Drawing Sheets

TOUCH ACTIVATED CONTROL METHOD AND APPARATUS

FIELD OF THE INVENTION

This invention pertains generally to the field of input/output systems for communicating with computers, and particularly to systems for the control of a cursor or pointer on the screen of a cathode ray tube display used in conjunction with a computer.

BACKGROUND OF THE INVENTION

Communication from a user to a computer may be accomplished in several ways using a variety of input devices. A traditional direct input device is a typewriter keyboard which can be used to transmit alphanumeric data directly into the computer. Most microcomputer systems also have a cathode ray tube (CRT) monitor which displays to the operator the text being supplied to the computer and also allows output communication from the computer to the user. The CRT display may also be used to generate graphics, and the operator can use the CRT screen to relate interactively with the computer by manipulating data or graphic images on the screen. One way in which the user and computer may actively interact is by allowing the user to move a cursor or pointer spot about the CRT screen in a manner of movement or to a position which has significance to the computer. Various devices have been developed which allow the user to selectively move the cursor spot on the CRT screen, including keyboard keys which direct movement of the cursor sideways or up or down, light pens, joy sticks, rolling balls and so-called "mouses." The motions of the user's hand are translated by these devices into commands to the computer to cause it to move the cursor in a direction indicated by the user.

While many devices presently exist which allow interactive cursor positioning, they are, by and large, not well integrated with the range of motions and actions normally employed by a typist when inputing alphanumeric information into a computer through a normal keyboard. Specifically, almost all commonly used cursor positioning devices require that the user remove his or her hand from the keyboard to reach the cursor positioning device, and generally the user's eyes must be diverted from the screen to the manipulatable device, at least momentarily, while the device is being held and used. Where cursor position manipulations on the CRT screen are intended to be integrated with inputing of alphanumeric information through the keyboard—as in word processing where the cursor positioning may be used to designate to the computer points of corrections, deletions, or insertions—a substantial loss in convenience and efficiency results due to the diversion of the user's attention from the keyboard. For example, when using a mouse-type positioner, the user must move his hand from the keyboard to grasp the mouse and must then push the mouse over a flat surface next to the keyboard until the cursor reaches the desired spot on the CRT screen. The user then removes his hand from the cursor and must find the proper position for his hand on the keyboard to begin typing operations again. Such off-keyboard cursor control devices also require the availability of additional clear space next to the keyboard and suffer from the greater wear and tear associated with the use of a mechanical element as compared with electronic components. Non-mechanical touch pad positioners have been developed which allow a user to control the cursor by moving the position of contact of his finger about the touch pad. While such touch controlled devices require less space and are less prone to mechanical problems, the prior touch pads typically allow the user to control the displacement of the cursor in only a relatively few discrete angular directions and are susceptible to a variety of noise sources.

SUMMARY OF THE INVENTION

The control device of the present invention allows the user to control the motion of a cursor on a CRT screen by relative finger touch positioning on a touch pad which may conveniently be mounted on or closely adjacent to the keyboard. A preferred position for the touch pad is immediately beneath the space bar on the keyboard so that it can be accessed by the user's thumb without requiring the user to remove his or her hand from the keys on the keyboard. The sensing of the relative position of the user's finger on the touch pad is done entirely electronically, with no moving parts, requiring very little effort by the operator to control the cursor and minimizing the wear problems customarily associated with mechanical cursor positioning devices.

The touch pad is composed of multiple, electrically isolated conductive plates, preferably arranged as sectors of a circle and covered by a clear dielectric material. When the user's finger touches the surface of the dielectric material, the user is capacitively coupled to the underlying conductive sectors. Each sector will thus have an effective capacitance proportional to the area of the sector covered by the user's finger. The sectors are then individual polled to determine the capacitance of each. This is preferably done by charging and discharging each sector through a known resistance. The capacity of each sector can then be deduced by the rise and decay time constant. Each sector is assigned a relative X and Y weighting as a function of its position with respect to assigned X and Y axes on the touch plate. The relative measured capacitance of each sector is then multiplied by the X and Y weighting for the sector to give its X and Y sector values. The X sector values and Y sectors values are then summed and the relative magnitudes of the X sum and Y sum give the relative position of the user's finger with respect to the origin of the X and Y axes. A "Z" value can also be determined by summing all of the weighted sector values. The Z value will be generally proportional to the total capacitance of all of the sectors or essentially equivalent to the total area of the conductive plates in the touch pad covered by the user's finger. If desired, the distance from the origin to the position of the user's finger may be determined by selecting the shape of the conductive sector plates to weight the X, Y, and/or Z values as a function of the distance of the area of touch from the origin. The X, Y, and Z signals determined in accordance with the foregoing procedure may be supplied as control characters to a computer to control the position of the cursor spot on the CRT screen.

The foregoing procedures are very effectively carried out with a dedicated microcomputer which controls an analog multiplexer and a charging and discharging circuit. The multiplexer has individual output lines connected to each of the conductive sector plates of the touch pad and receives the charging voltage from a charge and discharge circuit. The microcomputer commands the multiplexer to selectively charge and discharge a single sector and a fixed capacitor of capacitance roughly equal to that of an untouched sector plate. A pulse of length proportioned to the difference in the times of charging of the sector plate and the known capacitance is measured by the microcomputer's timer. The pulse length value is then used by the microcomputer to generate the relative X and Y sector values as described above, to calculate the X, Y and Z values and to issue cursor control characters.

Because of the structure of the touch pad, it can be made small enough to be mounted on a standard keyboard and particularly at a position just beneath the space bar. Because the touch pad can be made relatively small, all areas of the touch pad can be accessed within the range of movement of a user's thumb without requiring the user to change position of his or her hand. Finger position relative to the origin can be translated to velocity commands to the computer so that the velocity of the cursor in a selected direction will remain constant as long as the user retains his finger in position on the cursor. The magnitude of the velocity can be increased by the user by pressing harder on the touch pad, which increases the area of the user's finger which contacts the touch pad and therefore increases the relative capacitance of the sectors. Because of the manner in which the sectors are arranged, the user can command movement of the cursor in essentially any angular direction rather than being limited to translation of the cursor in only certain angular directions, as is the case with conventional touch pad positioners.

A major advantage of individual polling of the sectors, particularly by utilizing pulse charging and discharging to measure their capacitance, is that the timing may be arranged so that there is minimum susceptibility to noise sources, e.g., radio frequency interference, fluorescent light flicker, or sixty cycle power line coupling.

The manner of operation of the present invention allows information to be supplied from the user through the touch pad by user actions other than just the relative position of the user's finger with respect to the origin. As noted above, the pressure of the user's finger on the pad is reflected in a change in capacitance which can be used to vary the magnitude of the cursor positioning velocity signal. In addition, the dwell time of the use's finger on the pad can be translated into other control signals. For example, a tap of the user's finger on the touch pad can be translated to a control signal to the microcomputer to cause it to take some action, for example, beginning deletion of text matter at the position of the cursor when the tap occurs, or opening or closing a file designated by the position of the cursor.

Further objects, features, and advantages of the invention will be apparent from the following detailed description when taken in conjunction with the accompanying drawings.

DESCRIPTION OF THE PREFERRED EMBODIMENT

Figure 1:
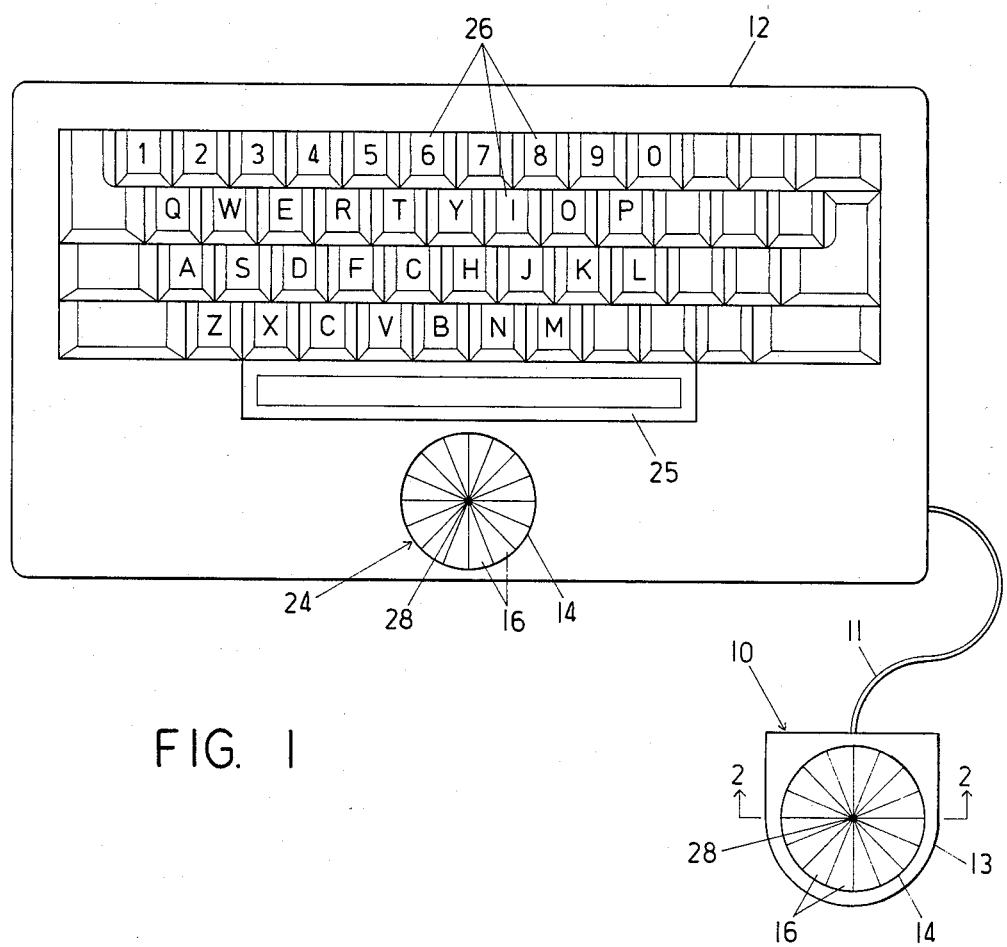
FIG. 1 is a top view of a keyboard showing the preferred and alternate mounting positions of a touch pad built into the keyboard, and an alternative stand alone touch pad unit which can be connected to the computer through the keyboard.

With reference to the drawings, a stand alone cursor control device in accordance with the invention is shown generally at 10 in FIG. 1 connected by a cord 11 to a computer keyboard unit 12. The cursor control device 10 has a case 13 adapted to sit on a flat surface such as a desk top. A touch pad 14 is mounted to the top of the case 13 in position to be touched by a finger of the user. The circular touch pad 14 is preferably of a size, e.g., three inches in diameter, which allows the entire surface of the touch pad to be easily and quickly accessed simply by finger movement of the user without substantial hand motion.

Figure 2:
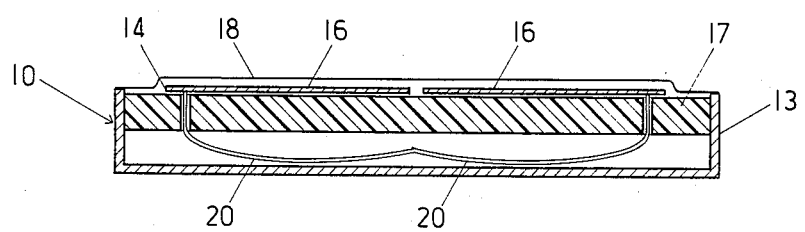
FIG. 2 is a cross-sectional view through the touch pad taken generally along the lines 2—2 of FIG. 1.

As also illustrated with respect to the cross-sectional view of FIG. 2, the touch pad 14 is formed of multiple wedge-shaped sector plates 16, preferably formed of a conductive metal such as copper, which are laid on a nonconducting dielectric substrate 17. A thin dielectric layer 18 is laid over the conducting sector plates 16 to protect the sectors and to insulate the sectors from direct electrical contact with the user's finger. As an example, the dielectric layer 18 may be formed of a thin layer of polyester plastic which is laid over the sector 16 and sealed to the substrate 17, or a thermoplastic material could be cast in a thin layer over the sectors if desired. Each of the sectors 16 is electrically insulated from the others and has a lead wire 20 which extends to the electronic components of the cursor control device which may be contained within the case 13.

For purposes of illustration, another touch pad constructed identically with the touch pad 14 may also be formed as an integral part of the keyboard 12, and the preferred arrangement and positioning of the touch pad 14 as part of the keyboard is illustrated at the position labeled 24 in FIG. 1. Preferably, the touch pad 14 at the position 24 is located just beneath the space bar 25. In this position of the touch pad, the user can readily reach all positions on the touch pad without having to move his or her hand substantially off of the keys 26. Another integral keyboard location for the touch pad is at the positioned labeled 27 in FIG. 1, replacing the conventional cursor control keys.

The sectors 16 are preferably visible through a substantially transparent dielectric layer 18 so that the user can substantially locate the central origin 28 of the touch pad. Alternatively, the touch pad may simply be marked with an indelible marking, e.g., embedded in the plastic dielectric, to help the user locate the origin. When the user places his or her finger over one or more of the sector plates 16, a capacitor is effectively formed between the sector or sectors 16 and the surface of the user's finger, as separated by the dielectric layer 18. The magnitude of this capacitance will be substantially proportional to the area of the finger of the user which is in contact with the surface of the dielectric layer. Thus, the harder that the user presses on the surface of the touch pad, the greater will be the magnitude of the capacitance seen by the conductive sectors 16 since a greater portion of the user's finger will tend to become pressed against the surface of the dielectric 18. The area of a particular sector 16 which is covered by a user's finger will be reflected in the amount of capacitance between that sector and the user's finger. Thus, the angular position of the user's finger can be determined by determining the capacitance at each of the sectors 16. The sectors are preferably polled individually, one at a time, by applying a signal thereto while no signal is applied to each of the other sectors. Because a signal is applied to the sectors one at a time, coupling between the sectors is minimized.

Figure 3:
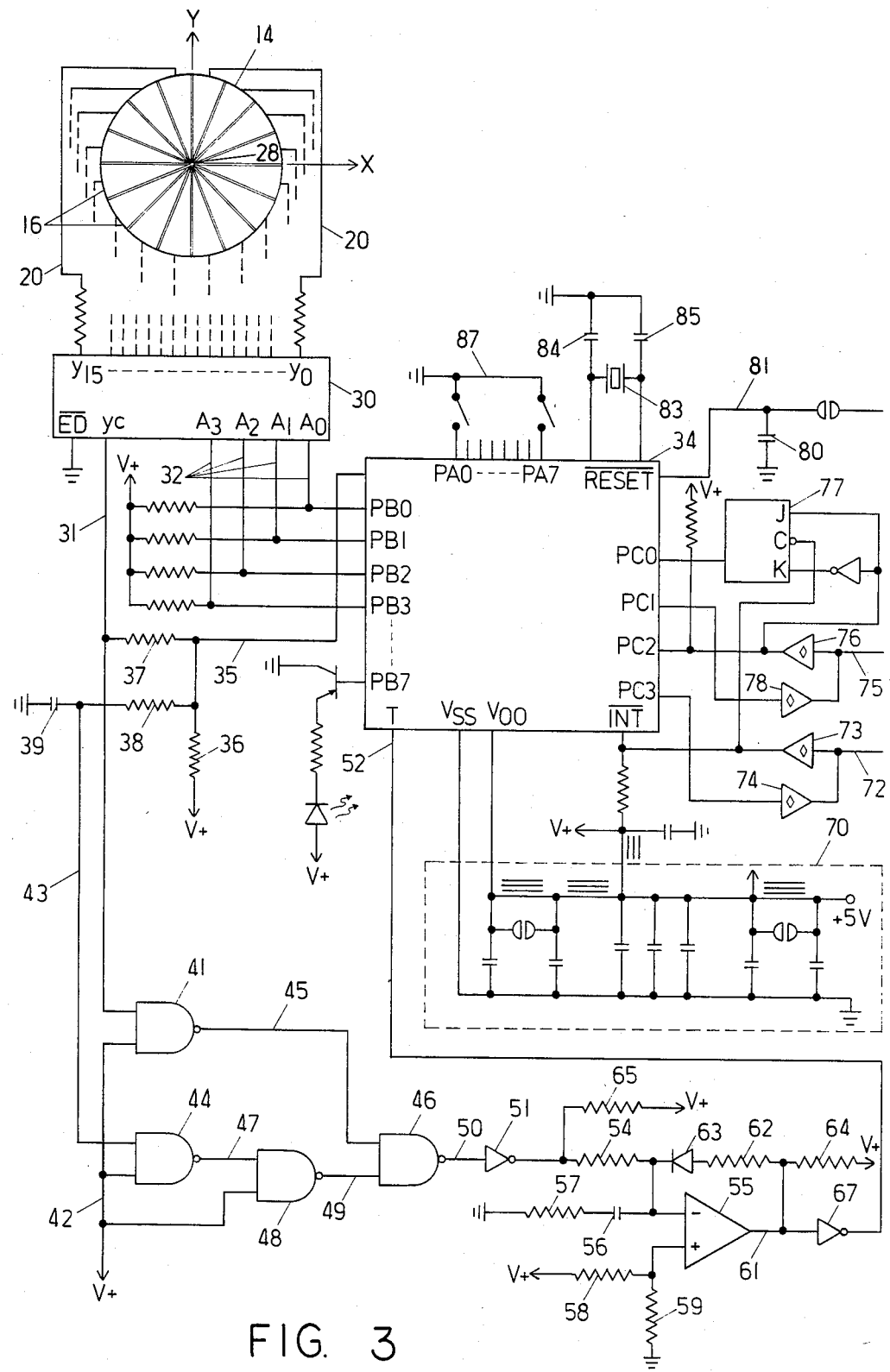
FIG. 3 is a circuit schematic diagram of the electronic components of the cursor control device.

An electronic circuit utilized for polling the individual sectors and calculating the relative capacity of each is shown in the schematic diagram of FIG. 3. Each of the conductive sector plates 16 is individually connected by one of the conducting wires 20 to a multiple channel (e.g., sixteen channels shown) analog multiplexer 30 (e.g., C04067BE analog multiplexer). The multiplexer 30 is operative to selectively connect one of the sixteen lines 20 to an output conductor 31. The particular input line 20 which is selected is determined by the signals provided on address bus lines 32 from a microcomputer 34 (e.g., MC68705P3L). In addition, the microcomputer 34 also provides an output signal, selectively high or low, on an output line 35 which is connected through a resistor 36 to the positive supply voltage. A resistor 37 is connected between the line 35 and the output line 31 from the multiplexer and a resistor 38 is connected to the line 35 and leads to a capacitor 39 connected to ground. The signal level set by the microprocessor on the line 35 is used to selectively charge and discharge the selected segment through the resistor 37. The signal on the line 35 also allows selective charging and discharging of the capacitor 39 through the resistor 38. The conducting line 31 is connected to one input of a Schmitt trigger NAND-gate 41 which receives its other input on a line 42 from the positive supply reference voltage. The junction between the resistor 38 and the capacitor 39 is connected by a line 43 to one of the inputs of another Schmitt trigger NAND-gate 44, the other input of which is connected to the positive supply voltage on the line 42. The output of the gate 41 on a line 45 is provided to one input of a Schmitt trigger NAND-gate 46 and the output of the gate 44 on a line 47 is provided to one input of a Schmitt trigger NAND-gate 48 which receives the positive supply voltage as its other input. The output of the gate 48 is provided on a line 49 to the other input of the gate 46. The pulse output of the gate 46 is provided on a line 50 to an inverter 51.

Figure 4:
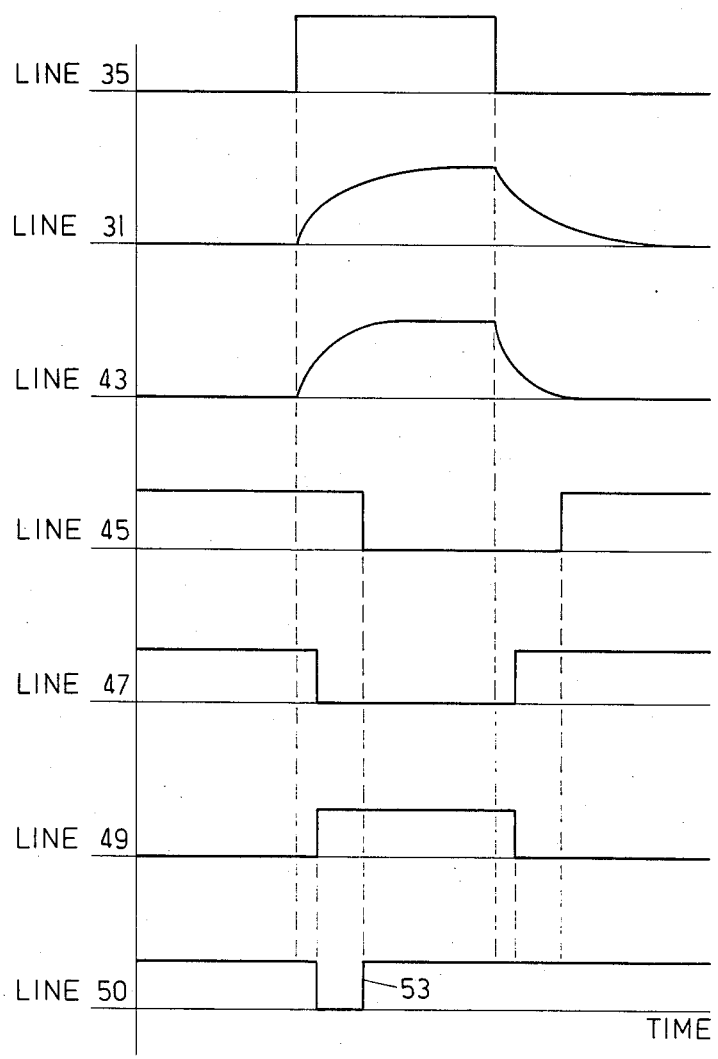
FIG. 4 is an illustrative view of the sector plate charging and discharging waveforms.

Assuming that the line 35 has initially been at a low or ground level, the voltage on the line 31 will be essentially at ground and the capacitor 39 will ultimately discharge through the resistor 38 to ground so that the line 43 will also be low or at ground level. When the line 35 goes high, the capacitor formed by the selected segment and the user's finger above it is charged through the resistor 37 until reaching the voltage level of the line 35. Similarly, the capacitor 39 is charged through the resistor 38 up to the line voltage 35. The relative position of the wave forms is illustrated in FIG. 4. When the voltage on the line 31 reaches the trigger level of the gate 41, the output line 45, which is initially high, goes low. Similarly, the output of the gate 44 on the line 47, initially high, goes low when the line 43 reaches the trigger level of the gate. The resistors 37 and 38 are preferably chosen to be equal in resistance and the gates 41 and 44 preferably have equal trigger levels, which may, in practice, be obtained by choosing both gates from the same integrated circuit package. The capacitance of the capacitor 39 is then preferably chosen to be equal to the (stray) capacitance typically present on the conductor 31 with a segment selected but not touched. Under these conditions, the capacitance on the line 31 will be greater than the capacitance of the capacitor 39, and therefore the line 31 will charge more slowly than will the capacitor 39 and the output signal on the line 45 will change state later than the output on the line 47. The output of the gate 46 on the line 50 will thus always be high except at those times when the signals on the lines 45 and 47 are not in the same state, resulting in the pulses illustrated at 53 in FIG. 4. The width of these pulses will be generally proportional to the difference between the charge and discharge times on the lines 31 and 43 or, equivalently, generally proportional to the additional capacitance seen on the line 31 as a result of the user touching (or very close to) the particular sector plate 16 being polled.

The length of the pulse 53 may now be directly timed by the microcomputer 34 utilizing its internal timer circuit. Because the pulses 53 on the line 50 can be of relatively short duration, it may be desirable, when using microprocessors having relatively low time resolution, to multiply the pulse length to a duration which can be more precisely resolved by the timing circuit in the microprocessor. Thus, rather than providing the pulse signal directly to the timer input 52 of the microcomputer 34, the output of the inverter 51, normally at a low logical level in the quiescent state, is supplied through a resistor 54 to the inverting input of an operational amplifier 55. A capacitor 56 and resistor 57 are series connected from the inverting input of the amplifier 55 to ground, and a voltage divider composed of resistors 58 and 59 provide a reference voltage to the non-inverting input of the amplifier 55. The output of the amplifier 55 on a line 61 is fed back through a resistor 62 and a diode 63 to the inverting input. The positive supply voltage is connected through a resistor 64 to the output line 61 and through a resistor 65 to the output of the inverter 51. The output of the amplifier 55 is inverted by an inverter 67 and supplied to the timer input 52 of the microprocessor.

The resistor 62 and diode 63 feed back the signal on the output line 61 whenever it is at a higher potential than the inverting input to the amplifier which serves to stabilize the quiescent operating point and prevent internal saturation. The operating point output level from the amplifier 55 is chosen to avoid saturation but still exceed the logical high input threshold of the inverter 67. The resistors 58 and 59 are preferably chosen to provide a selected bias voltage to the non-inverting input of the amplifier which is equal to approximately one-sixth of the supply voltage level.

The ratio by which the length of a pulse at the output of the inverter 51 is multiplied will be approximately the ratio of the logical high potential to the potential level at the non-inverting input of the amplifier. The output of the inverter 51 will normally be low. When a pulse occurs, the amplitude of the inverter output goes high for the length of the pulse, which causes the capacitor 56 to charge through a current loop which includes the resistors 54 and 57. The potential at the inverting input to the amplifier 55 reaches a level to drive the output of the amplifier 55 low and turn off the diode 63. Because of the voltage dropped immediately across the resistor 57 as the capacitor 56 is charging, the voltage at the inverting input to the amplifier 55 will quickly drive the output of the amplifier low. When the pulse at the output of the inverter 51 ends, the capacitor 56 discharges through the resistor 54 until the potential on the inverting input to the amplifier is less than that on the non-inverting input. The amplifier 55 output then swings high and increases until the diode 63 conducts and the feedback stabilizes the output voltage level of the amplifier. Since the magnitude of the voltage across the resistor 54 is approximately five times as large (five-sixths of supply voltage) during the charging of the capacitor 56 as it is during the discharge (one-sixth of supply voltage), the length of the pulse is multiplied by approximately a factor of five. The output of the inverter 67 is a high-going pulse—the inverse of the output of the amplifier 55—which is appropriate for providing to the timer input 52 of the microcomputer.

The network indicated within the dashed lines labeled 70 in FIG. 3 provides radio frequency bypassing of the microcomputer and other logic components to isolate the circuitry from the power supply at radio frequencies.

For illustrative purposes, the control circuitry shown in FIG. 3 is adapted to be connected to a computer keyboard substantially as a replacement for a mechanical mouse-type input. Thus, a connecting line 72 is provided which, for example, may extend to the clock line of an IBM-PC type keyboard connector. An isolation gate 73 connects the clock line to the microcomputer INT line for input and an isolation gate 74 connects the line 72 to the PC3 output of the microcomputer. A line 75 may extend to the data line of an IBM-PC type keyboard connector and is connected through an isolation gate 76 to the PC2 input of the microcomputer. The output of the gate 76 is also provided to the J and K inputs of a flip-flop 77 and the output of the gate 73 is provided to the clock input of the flip-flop. The microcomputer output PC1 is provided to an isolation gate 78 the output of which is connected to the data line 75, and the output of the flip-flop 77 is provided to the PC0 input of the microcomputer. The flip-flop 77 will latch the state of the data signal from the line 75 on each low going clock transition provided from the line 72 and the latch signal will be provided from the output of the flip-flop to the PC0 input. This arrangement reduces the hold time for the data signal on the line 75—relative to the clock signal on the line 72—to the hold time of the flip-flop 77, which is a more practical hold time than the interrupt response time of the microcomputer.

A capacitor 80 is connected from ground to the line 81 leading to the reset input of the microprocessor 34 to provide a desired power-on reset circuit. The reset signal from the IBM PC keyboard may alternatively be connected to the reset line 51.

A crystal resonator 83 and capacitors 84 and 85 provide an internal clock signal to the microcomputer for operation at approximately 4 MHz. An eight channel switch unit 87 provides a selectible input byte to the microcomputer inputs PA0 to PA7 for testing and configuration purposes, if desired.

The microcomputer 34 may be programmed to provide signals which actuate all of the circuitry connected to it with the program contained in a PROM memory unit (not shown) connected to the microcomputer in the conventional manner. For example, a typical cycle for reading the touch pad preferably starts with the selection of the first sector plate to be read by the placement of its selection code on the output terminals PB1 through PB4. Simultaneously, the output PB0 is brought low to discharge the sector plate. After a suitable time, e.g., 100 microseconds, PB0 is brought high to charge the sector plate and enable the pulse-forming circuitry. At this time, the microcomputer's timer is initialized so that it will count for the duration of the pulse. When the timer has stopped counting, the count is processed and stored. This cycle is repeated until all segments have been measured. The measurement for each sector will yield a count which contains a quiescent value plus an additional value proportional to any additional capacitance created by the touch of a finger or other object contacting the dielectric layer 18 or in close proximity thereto. The sectors may be polled in a simple clockwise or counterclockwise sequence, but they are preferably read in a clockwise or counterclockwise sequence of opposite pairs to minimize the effects of hum, cross talk, and interference.

After the readings have been taken for all of the sector plates, they may be combined with each other to create X-Y or polar coordinate readings to indicate where the pad is being touched, or a Z reading, which indicates what portion of the total pad area is being touched. The readings may also be combined with previously accumulated readings to calculate time dependent results, such as whether the pad has just been touched and how hard and how quickly. For example, the X-Y coordinates may be determined by assigning each segment an X and Y weight, essentially according to trigonometric functions of the angular position of the segment about the origin, and then adding the X and Y readings for each of the segments to obtain an average X and Y coordinate. For example, a look-up table may be stored with weighting factors $X_i$ and $Y_i$ according to the expressions $$X_i = \cos\left(\frac{2\pi i - \pi}{n}\right) \text{ and } Y_i = \sin\left(\frac{2\pi i - \pi}{n}\right)$$

where i is the number of the particular sector in counterclockwise order from the X axis and n is the total number of sectors. The sum of all counts yields the Z reading. At the time of reset, a series of initial readings may be taken and averaged, to produce offset compensation values (tares) to be added to the X, Y, and Z readings to thereby produce final readings which are as free as possible from offsets. Preferably, the untouched plate should produce readings which indicate that X=0, Y=0, and Z=0. After the final readings are produced, a further process in the program for the microcomputer then issues a cursor control character to the displacing computer in the appropriate direction and at a frequency dependent on the calculated magnitude of the X and Y coordinates.

A Z magnitude dependent, time-dependent result may also be calculated to detect a rapid touch, which can be used to instruct the displaying computer to take an appropriate action once the cursor has been positioned. This may be done by having the microcomputer program establish a series of data cells which are used such that, after each set of measurements for all of the segments, and the calculation of the Z value, the Z reading is averaged with the value assigned to the first cell. For each Z reading after that, the first cell reading is averaged with the second cell, and so on. If the contents of the next to the last cell in the series exceeds the contents of the last cell by some threshold value, the onset of a rapid touch by the user may be recorded. If the contents of the next to last cell is less than the contents of the last cell by another threshold, the end of a rapid touch may be recorded. If the end of a rapid touch follows the onset by a sufficiently short period of time, the program may then issue a character signifying this fact to the computer. The weightings used in the cell averaging process determine the cut-off frequency of the filter; the threshold values control the intensity of touch required to issue the character to the computer and the number of cells determines the roll off rate (6 dB per octave per cell) of the filter.

To issue a character to the displaying computer, the microcomputer is programmed to provide a train of clock pulses on the output PC3 which is passed through the isolation gate 74 to the clock line 72. Simultaneously, a series of data levels is issued on the output PC1 to the line 75. The quiescent state of both output ports is high. A character is provided to the displaying computer by first setting the data level on the output PC1 and, after a time interval, bringing the PC3 output low. After another time interval the output PC3 is brought high again. After the passage of another time interval, a new data level is issued on PC1 and the process repeated to bring PC3 low and then high again. The process is repeated as necessary (e.g., for the IBM PC, nine times, to provide a start bit and eight data bits) to issue a key press or key release code. As an alternative, for an ASCII asynchronous connection, only one line must be manipulated, requiring a start bit, seven or eight data bits, and a stop bit, with transitions occurring at a rate determined by the baud-rate of the receiving computer's channel. As a further alternative, the PA0—PA7 eight-bit data port may be connected to the parallel port of a computer with the lines 72 and 75 used for hand shaking.

Figure 5:
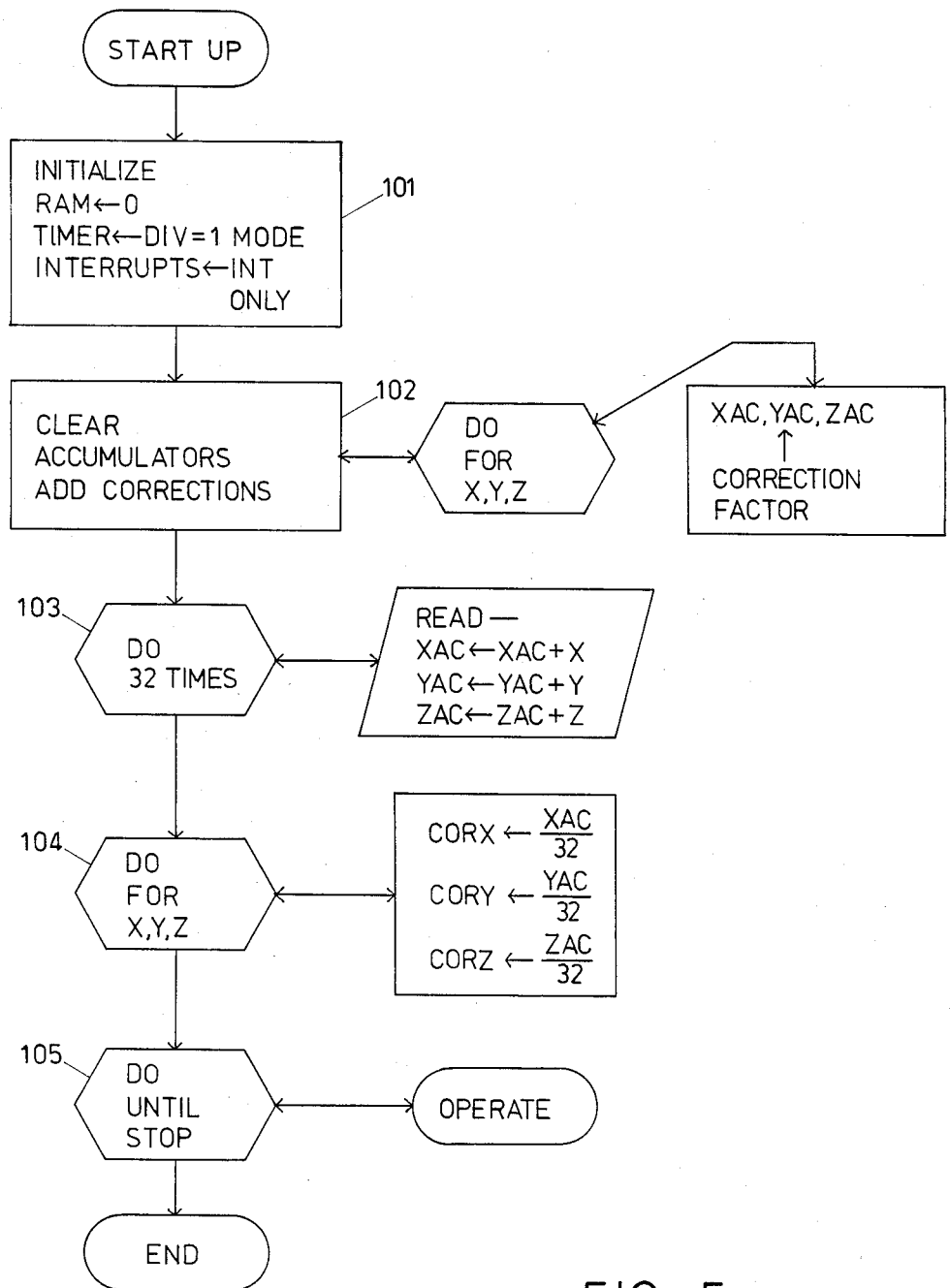
FIGS. 5–8 are flow charts showing the major operations of the program carried out within the microcomputer which controls the operation of the device.

The basic operation of the programming in the microprocessor 34 is illustrated in the flow charts of FIGS. 5-8. With reference initially to FIG. 5, after start-up the microcomputer is initialized (block 101) by clearing the RAM and setting the internal timer to the divide by one mode. The X, Y, and Z accumulators are then cleared (block 102) and supplied with a small empirically determined correction value to correspond to zero output with no input. The program then proceeds through a selected number (e.g., 32) of read cycles (block 103) at the initiation of operation with the touch pad untouched. The X, Y, and Z values obtained through the several cycles are then averaged and stored as a "correction" value (block 104) and the program proceeds to the normal operation routine (block 105) until the operator terminates the program.

Figure 6:
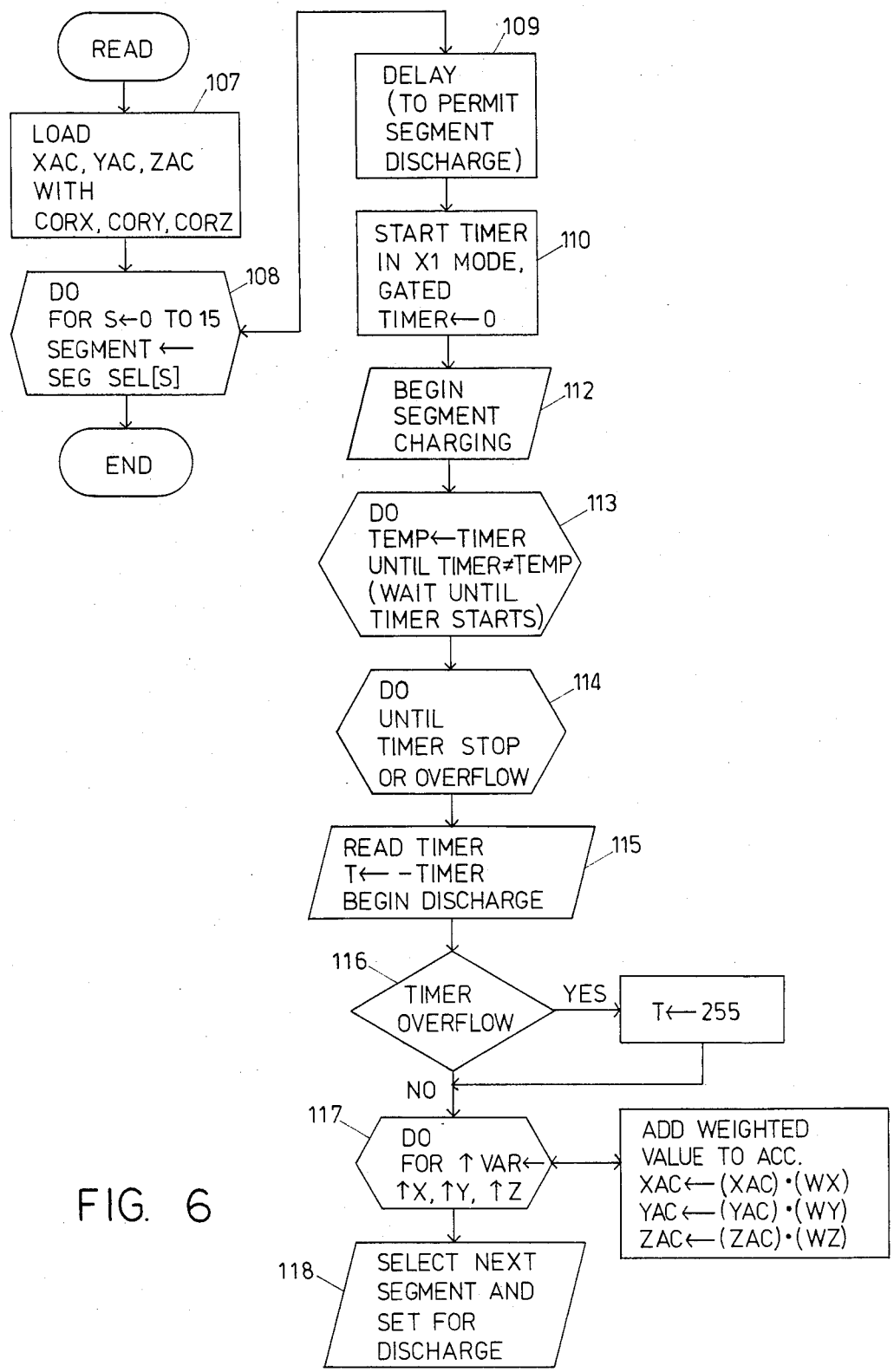

The Read sequence, shown in FIG. 6, begins with loading of the X, Y, and Z accumulators with the X, Y, and Z corrections previously determined (block 107). Then for each of 16 sectors designated 0 to 15, a sector is selected in accordance with a predetermined routine (e.g., a look-up table may be provided in ROM which designates the order of sectors to be read). The sectors are preferably not read in sequential order but rather in opposite pairs to reduce hum. After selection of a sector and output of the sector select address on the lines 32, a time delay is set (block 109) to permit discharging of the sector. The timer is then started and counted down to zero (block 110) and readied for receipt of a pulse on a line 52. Sector charging then begins (block 112) by providing a logical high output signal from the output PB0 on the line 35. The program then waits until the timer starts (block 113) and then loads the timer into a temporary variable (Temp), waiting until the timer stops or overflows (block 114) and then reading the timer (block 115) and beginning discharge of the sector by setting output PB0 on line 35 to logical 0. To accommodate a one byte maximum size for the timer variable T, if the timer overflows the value of the timer indicator is set to the maximum eight-bit value. The X, Y, and Z accumulators now are updated by adding the weighted X and Y value times the count in the timer variable T to the X and Y accumulators. As described above, the X and Y weightings may be determined from sine and cosine look-up tables provided in ROM which vary as a function of the angular position of the selected segment. After updating of the variables, the next segment is selected and set for discharging (block 118), and the cycle repeated.

Figure 7:
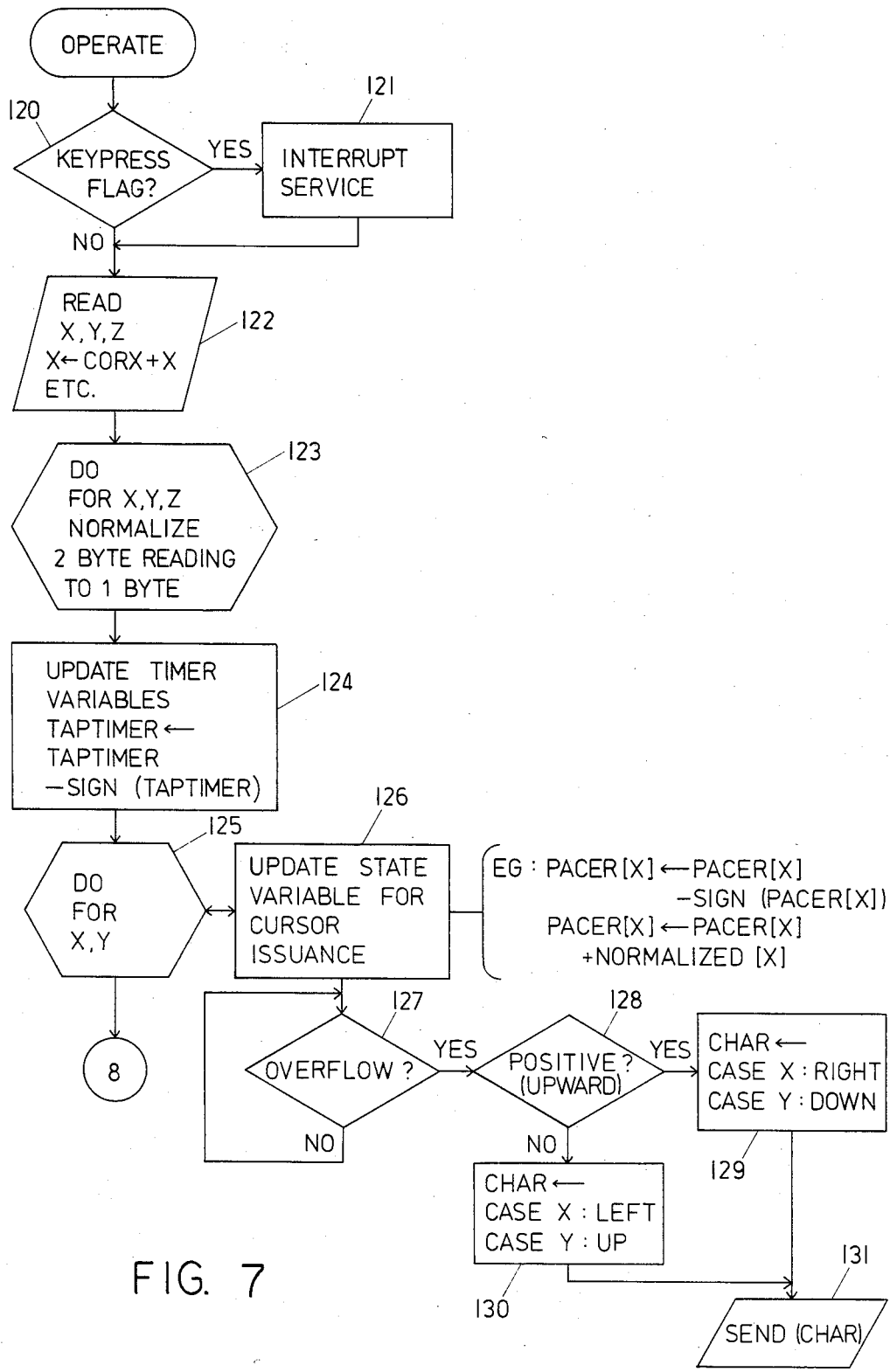

The Operate routine is illustrated in FIG. 7 and initially determines whether there has been a key press flag (block 120) received from the keyboard. If so, the program proceeds to an interrupt service routine (block 121). Normally, the program will proceed to the Read routine (block 122) to acquire the X, Y, and Z readings. The X, Y, and Z data may, if desired, be normalized (block 123) by converting the two byte readings to one byte normalized values. Once during each loop the timer variables are upated (block 124) and the X and Y cursor control characters are transmitted to the displaying computer (block 125) with a looping routine. Initially, the state variable for cursor issuance is updated (block 126) by designating Pacer [X] and Pacer [Y] variables which are updated each reading cycle, e.g., about 60 times a second. The Pacer variables are updated by replacing them with the previous pacer variable plus the normalized X or y reading (scaled to one byte) and each pacer variable is then debited by one (either adding or subtracting to reduce the absolute magnitude of the Pacer variable). The X and Y Pacer variables are checked for overflow (block 127); if so, the overflow is checked to determine if it is positive or negative. If positive, a character variable is set (block 129) to move the cursor in the X direction right or in the Y direction down; if negative, the character variable is set to move the cursor in the X direction left and in the Y direction up (block 130). These characters are then sent (block 131) to the displaying computer. The larger the X and Y values, the more often there will be an overflow in the X and Y Pacer variables and the X and Y cursor pulses will be issued to the displaying computer at a rate proportional to the X and Y values (thus causing the speed of cursor displacement to vary in proportion of the magnitude of the X and Y values) with a small minimum threshold or dead zone within which no cursor signals will be sent.

The ratio of X value to Y value should remain essentially constant as the user's finger moves outwardly from the origin along a radial line. However, the absolute magnitudes of the X and Y values may change, preferably monotonically increasing, as the position of touch moves outwardly. The speed of motion of the cursor will then be a function of the distance from the origin to the position of the user's finger. A variation of X and Y magnitudes with distance from the origin can be obtained with a touch pad having wedge shaped conductive sectors. As illustrated in FIG. 3, the conductive sector plates 16 are spaced from each other to provide electrical isolation. For the same reason, the innermost points of the sector plates are spaced from each other, leaving an open space at the center of the touch pad, as shown in FIG. 2. As noted above, the X and Y values are proportional to the area of the conductive plates covered by the user's finger. Because of the spacing between the plates, the user's finger will cover a relatively smaller total plate area at the center or origin of the touch pad than at the periphery, and the relative plate area to total area covered by the finger will increase steadily from the origin to the periphery. This variation in X and Y magnitude with distance from the origin can be enhanced or minimized, as desired, by widening or narrowing the spacing between the conductive plates.

The increases in X and Y magnitudes with distance of the finger touch from the origin will, using the cursor, control signal generating scheme described above, result in a speed of cursor movement which is proportional to the change in X and Y magnitudes. Of course, it should be noted that the X and Y magnitudes need not necessarily increase in direct proportion to distance from the origin, since the relationship depends on the construction of the touch plate.

The speed of cursor movement also need not be a linear function of X and Y magnitude. A nonlinear function in which cursor speed increases rapidly as the position of touch approaches the edge of the touch pad may be desirable for some applications. As one example of the implementation of a nonlinear function relationship between X and Y magnitude and cursor speed, the algorithm for updating state variables for cursor issuance at block 126 can include the following operations:

If PACER $[X] < A$ then PACER $[X] \leftarrow 0$ where A is a constant chosen to provide a desired dead zone near the origin, and, otherwise PACER $[X] \leftarrow$ (PACER $[X]$) $\times$ (PACER $[X]$) $-$ SIGN(PACER$[X]$)

The X and Y PACER variables are used to issue cursor control pulses as described above.

Figure 8:
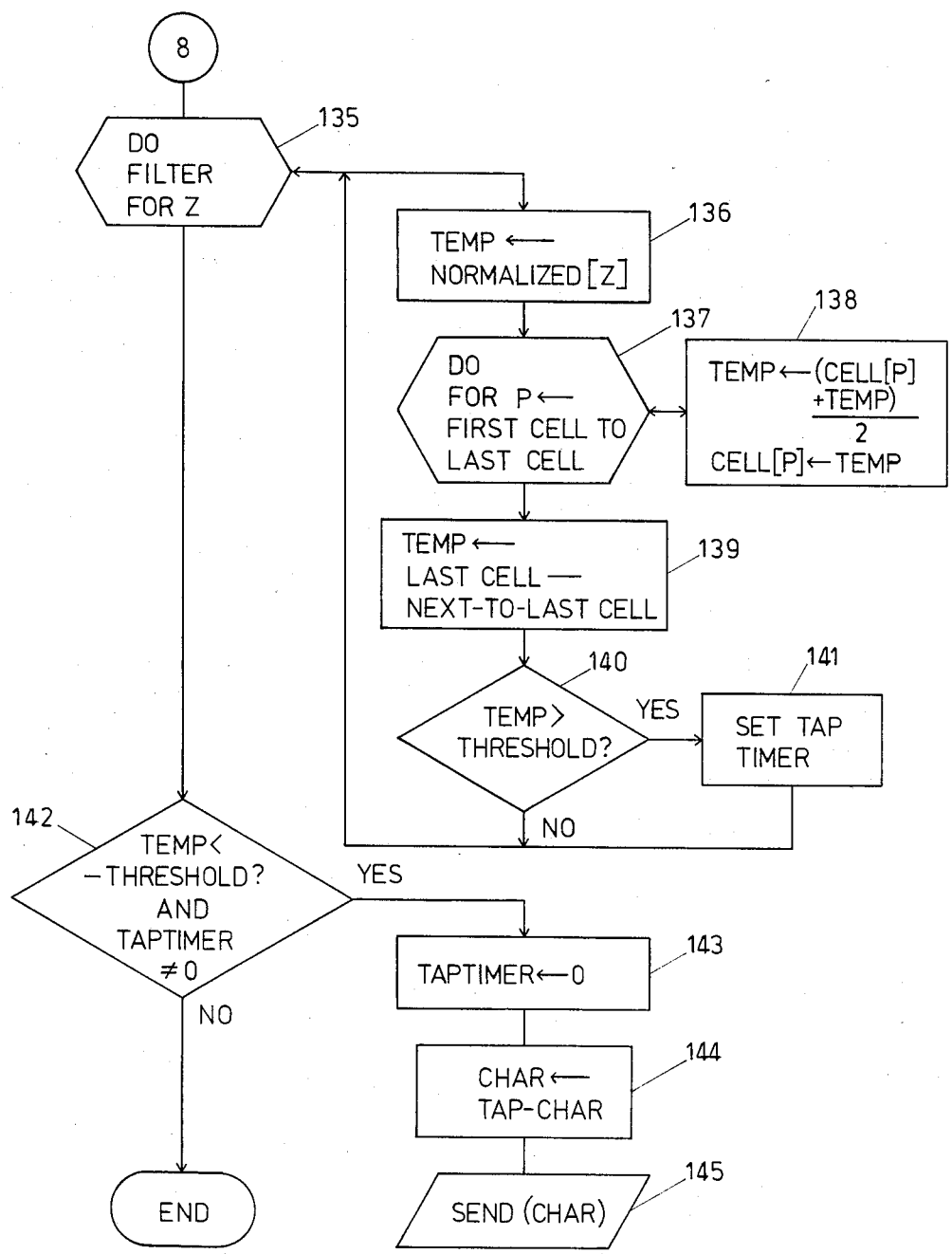

The Z value, or total counts for a complete reading of the touch pad, can be utilized to make certain determinations concerning the pressure or duration of the touch by the user, as illustrated in FIG. 8. As noted above, the X and Y values are subject to relatively low noise interference because of the pair-wise selection of sectors which tends to average out or balance out noise signals. The Z value does not necessarily benefit from the averaging for noise reduction and it is thus necessary to filter out high frequency components from the Z value if it is desired to utilize the sensing of the touch magnitude to make certain temporal calculations, such as the duration of touch by the user's finger. Such filtering may be accomplished as shown in FIG. 8 by providing a loop (block 135) that initiates by loading the normalized Z reading into a temporary variable (Temp 136) and setting up a series of cells (e.g., four cells); and proceeding through a loop (137) for each cell P, from one to four, by adding the value in the cell P to Temp, dividing by two (or some other weighting, if desired), and substituting the result into Temp, then substituting the value of Temp into cell P. After this is done for the four cells, the value of the next to last cell is subtracted from the last cell and the difference transferred to Temp (block 139). If this value of Temp is greater than a threshold, the Tap Timer variable is set to a selected time value. If the Z value is changing very slowly, or not at all, the value of Temp will be very small and below the threshold. Only if Z is changing rapidly, as when the touch pad is initially touched, will the value of Temp be above the threshold. The Z filter cycle continues with the value of Temp being continuously tested with respect to a second threshold to determine if it is less than the negative threshold (block 142). If Temp becomes more negative than a selected negative threshold, this is an indication that the user's finger is being rapidly removed from the touch pad and the Z values are rapidly declining. As indicated above at 124, the Tap Timer variable will be debited each time the touch pad is read and will decline to a zero value after the selected period of time. If, however, the value of Temp decreases below the negative threshold before the Tap Timer is timed out, this is an indication that the user has rapidly touched or tapped the touch pad. The Tap Timer value is then set to zero (143) a tap character formed (144), and a tap character sent to the displaying computer (145).

Figure 9:
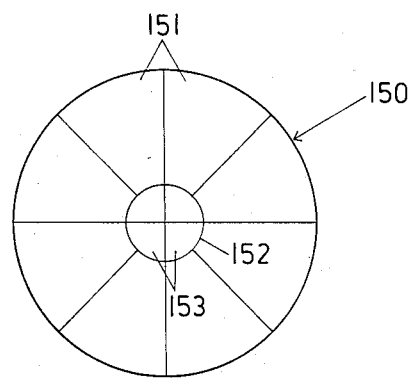
FIGS. 9–11 are views of alternative plate arrangements for the touch pad.
Figure 10:
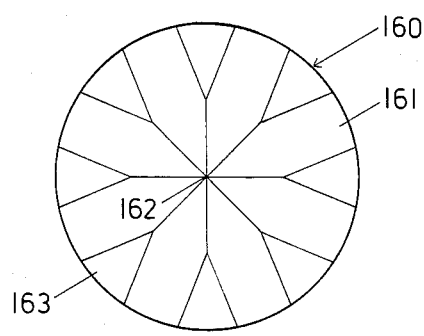
Figure 11:
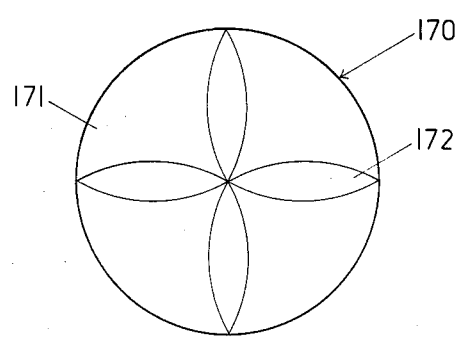

It is apparent that many variations of the above described embodiment may be utilized within the scope and concept of the present invention. For example, analog or discrete digital components may be utilized to replace the functioning of the microprocessor described above. Other constructions for the touch pad may also be utilized within the scope of the present invention. For example, the methodology of the present invention may be used to detect the position or time of touch of a user's finger on touch panels formed of linear or rectangular arrays of touch sensitive plates, or even discrete, physically separated touch plates. Other forms and shapes for the conductive plates may also be constructed which allow determination of the position of touch with respect to an origin. Examples of these are shown in FIGS. 9-11. The touch pad 150 shown in FIG. 9 has a series of outer sectors 151 which terminate at an inner ring 152, with four smaller partial sectors 153 inside the ring 152. The outer sectors 151 and the inner sectors 152 may be polled in the manner described above with different weightings given to the inner and outer sectors. Similarly, the touch pad 160 shown in FIG. 10 has separate plates 161 which reach to the origin 162 and outer plates 163 which do not. The plates 161 and 163 may again be individually polled as described above to provide detection of a user's finger on the touch pad in accordance with the relative weightings that can be assigned to the various plates as a function of their angular and radial position on the touch pad. The touch pad 170 of FIG. 11 has conducting contact plates 171 which detect a user's touch which are separated by non-conducting areas 172. The conducting areas 171 are formed to taper to a narrow portion toward the origin of the plates so that lesser capacitance values will automatically be detected by the system when the user's finger is closer to the origin than when it is further away from the origin. Thus, the magnitude of the X and Y velocity characters provided for cursor control to the displaying computer will be a nonlinearly increasing function of the distance of the user's finger from the origin.

It is understood that the invention is not confined to the particular construction and arrangement of parts herein illustrated and described, but embraces such modified forms thereof as come within the scope of the following claims.

What is claimed is:

1. Apparatus for use in providing touch commands from a user, comprising:
   (a) a touch pad having a plurality of plates defining sectors arrayed about a central origin, each sector plate formed of an electrically conductive material and electrically isolated from the other sector plates, the plates being covered by a dielectric layer which is exposed to the touch of a user;
   (b) means electrically connected to each of the sector plates for detecting the relative area of each plate covered by an object which can capacitively couple thereto such as a user's finger based on a change in capacitance of each sector plate which will be in proportion to the area of the sector plate that is covered by the object, for calculating the relative X and Y positions of the object with respect to the rigin of the touch pad based on the relative areas of each late covered by the object, and for providing an output signal indicative thereof.

2. The apparatus of claim 1 wherein the sector plates are formed of a thin layer of conducting metal laid on a dielectric base and wherein the conducting plates are in the same plane and are covered by the thin layer of dielectric material such that the object when in contact with the dielectric material over the sector plates will produce the change in capacitance of each sector plate.

3. The apparatus of claim 2 wherein the sector plates are spaced from each other a selected distance such that the total area of sector plates covered by the object increases with the distance of touch from the origin.

4. The apparatus of claim 1 wherein the means for determining the area of each sector plate covered by an object determines the change in the capacitance of each sector plate when the object is covering a portion of it.

5. The apparatus of claim 4 wherein the means for detecting the change in capacitance of each sector plate does so by applying a pulse of voltage to each plate to selectively charge and discharge each sector plate individually and detects the time constants of the charging-discharging wave form of the voltage applied to each sector plate.

6. The apparatus of claim 1 wherein the means for detecting the area of each sector plate covered by the object also determines the total area of all of the sectors plates covered by the object and provides an output signal indicative thereof.

7. The apparatus of claim 1 wherein the means for determining the area of each sector plate covered by the object also measures the time that the object covers the sector plates and provides an output signal if the time which the object covers the plates is less than a selected time period.

8. The apparatus of claim 4 wherein the means for detecting the change in capacitance of the sector plates and providing an output signal indicative of the relative X and Y position of the object with respect to the origin of the touch pad does so by assigning a weighted value to each sector plate in relation to its angular position about the touch pad, by multiplying the relative change in capacitance when the object is covering a sector plate by the X and Y weightings for such sector to provide X and Y relative sector values, by adding all of the X relative sector values and all of the Y relative sector values to determine X and Y sector sums which are proportional to the relative X and Y position of the object on the touch pad.

9. The apparatus of claim 8 wherein the relative X and Y positions are divided by the total change in capacitance for all of the sector plates.

10. The apparatus of claim 8 wherein the means for detecting the change in capacitance of each sector plate produces a pulse signal which is proportional in length to the change in capacitance of the selected sector plate and including means for measuring the length of the pulse and providing a digital signal representative thereof.

11. In a computer terminal having a keyboard with a standard set of alphanumeric keys and a spacer bar extending under the keys, the improvement comprising:
   (a) a touch pad mounted in the keyboard immediately adjacent to and on the opposite side of the spacer bar from the keys such that the touch pad can be reached by the thumb of an operator whose hand is placed on the keyboard, the touch pad having a plurality of electrically conducting sector plates arranged about a central origin and electrically isolated from each other, the plates being covered by a dielectric layer which is exposed to the touch of the operator; and
   (b) means electrically connected to each of the sector plates for detecting the relative area of each of the sector plates covered by the operator's finger based on the change in capacitance of each sector plate which will be in proportion to the area of the sector plate that is covered by the operator's finger and calculating the relative X and Y positions of the area of contact of the operator's finger with respect to the origin of the touch pad based on the relative areas of each plate covered by the operator's finger, and for providing an output signal indicative thereof to the cursor control output of the keyboard.

12. The apparatus of claim 11 wherein the sector plates are formed of a thin layer of conducting metal laid on a dielectric base and wherein the conducting plates are in the same plane and are covered by the thin layer of dielectric material such that the operator's finger when in contact with the dielectric material over the sector plates will produce the change in capacitance of each sector plate.

13. The apparatus of claim 12 wherein the sector plates are spaced from each other a selected distance such that the total area of sector plates covered by the user's finger increases with the distance of touch from the origin.

14. The apparatus of claim 11 wherein the means for determining the area of each sector plate covered by an operator's finger determines the change in the capacitance of each sector plate when the finger is covering a portion of it.

15. The apparatus of claim 14 wherein the means for detecting the change in capacitance of each sector plate does so by applying a pulse of voltage to each plate to selectively charge and discharge each sector plate individually and detects the time constants of the charging-discharging wave form of the voltage applied to each sector plate.

16. The apparatus of claim 11 wherein the means for detecting the area of each sector plate covered by the operator's finger also determines the total area of all of the sectors plates covered by the finger and provides an output signal indicative thereof.

17. The apparatus of claim 11 wherein the means for determining the area each sector plate covered by the operator's finger also measures the time that the finger covers the sector plates and provides an output signal if the time which the finger covers the plates is less than a selected time period.

18. The apparatus of claim 14 wherein the means for detecting the change in capacitance of the sector plates and providing an output signal indicative of the relative X and Y position of the finger with respect to the origin of the touch pad does so by assigning a weighted value to each sector plate in relation to its angular position about the touch pad, by multiplying the relative change in capacitance when the finger is covering a sector plate by the X and Y weightings for such sector to provide X and Y relative sector values, by adding all of the X relative sector values and all of the Y relative sector values to determine X and Y sector sums which are proportional to the relative X and Y position of the finger on the touch pad.

19. The apparatus of claim 18 wherein the relative X and Y positions are divided by the total change in capacitance for all of the segment plates.

20. The apparatus of claim 18 wherein the means for detecting the change in capacitance of each sector plate produces a pulse signal which is proportional in length to the change in capacitance of the selected sector plate and including means for measuring the length of the pulse and providing a digital signal representative thereof.

21. Touch activated controlling apparatus comprising:
(a) a touch pad having a plurality of conductive plates arranged adjacent to and electrically isolated from one another and a thin dielectric layer covering the conductive plates such that a user touching the top surface of the dielectric layer will change the capacitance of each plate beneath the user's finger in proportion to the area of the plate covered by the finger;
(b) means electrically connected to each of the conductive plates for applying a pulse signal to each of the individual plates sequentially to charge and discharge the plates and providing an output signal indicative of the change in capacitance of each plate caused by the touch of the user as determined from the charging-discharging waveforms for each plate; and
(c) means receiving the signal indicative of the change in capacitance of each of the plates for determining the relative position of the touch by a user on the touch pad based on the relative change in capacitance of each plate and a preselected orientation weighting factor assigned to each plate and for providing a signal indicative of the relative position of the user's touch on the touch pad.

22. The apparatus of claim 21 wherein the touch pad comprises a dielectric base, a plurality of conducting plates arranged as sectors of a circle lying on the dielectric base about a central origin and a layer of dielectric material covering the sector plates.

23. The apparatus of claim 22 wherein the sector plates are spaced from each other a selected distance such that the total area of sector plates covered by a user's finger increases with the distance of touch from the origin.

24. The apparatus of claim 21 including an analog gate, the input of which is provided with a pulse signal and having plural output lines one each of which is connected to one of the conductive plates, and being controlled by a signal on input lines to connect the input pulse signal to a selected one of the output lines and thence to a selected one of the conductive plates.

25. The apparatus of claim 21 wherein the means for applying a pulse to each of the conductive plates provides the same pulse to a known capacitance, and wherein the time for the pulse wave form into the selected conductive plate to reach a selected height and the pulse input into the known capacitance to reach a selected height are compared such that the difference in these times is proportional to the difference in capacitance of the selected plate and the known capacitance, and for providing an output signal proportional to the difference in capacitance.

26. The apparatus of claim 22 including a microcomputer which stores the change in capacitance value for each sector plate and determine the X and Y sector values as a function of the angular position of the sector plates about the origin as a sine function for the Y direction and a cosine function for the X direction.

27. The apparatus of claim 25 including means for increasing the length of the pulse which corresponds to the difference in charging times of the selected sector and known capacitance by a selected multiple.

28. A method of determining the relative position of the portion of a user's finger which touches a touch pad having plural conductive segments arranged as electrically isolated sectors of a circle about an origin, comprising the steps of:
(a) individually supplying a pulse of electricity to each of the sectors of the touch pad;
(b) measuring the time of charge of each sector relative to a known capacitance, whereby the difference in the time of charge of each sector and the known capacitance will be proportional to the difference in capacitance between the conductive sector and the known capacitance;
(c) determining a number proportional to the relative time difference between the charging of each sector and the known capacitance;
(d) multiplying for each sector the number proportional to the change time times an X weighting factor and a Y weighting factor which are functions of the angular position of the sector with respect to the origin of the touch pad;
(e) adding the weighted X and Y sector values to determine a total X value and a total Y value which are indicative of the relative angular position of the contact of the user's finger on the touch pad with respect to the origin.

29. The method of claim 28 including the additional steps of dividing the total of the numbers proportional to capacitance of each of the sectors to provide a total capacitance sum and dividing this total into the X and Y weighted sum values to determine relative X and Y position coordinates.

30. The method of claim 28 including the additional steps of providing pulses to the sectors of the touch pad in an order such that sectors on opposite sides of the origin of the touch pad are sequentially provided with pulses to minimize noise and interference between sectors.

31. The method of claim 28 wherein the steps (a) and (b) are repeated until the user's finger is removed from the touch pad and the total time that the user's finger is in contact with the touch pad is determined and an output signal provided if the time that the user's finger is on the touch pad is less than a selected time interval.

* * * * *